United States Patent
Mizuno et al.

(10) Patent No.: US 11,751,374 B2
(45) Date of Patent: Sep. 5, 2023

(54) AUTOMATED REPLACEMENT SYSTEM FOR PRODUCTION LINE

(71) Applicant: FUJI CORPORATION, Chiryu (JP)

(72) Inventors: Sota Mizuno, Okazaki (JP); Masashi Kimura, Nishio (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/642,762

(22) PCT Filed: Sep. 27, 2019

(86) PCT No.: PCT/JP2019/038166
§ 371 (c)(1),
(2) Date: Mar. 14, 2022

(87) PCT Pub. No.: WO2021/059490
PCT Pub. Date: Apr. 1, 2021

(65) Prior Publication Data
US 2022/0338396 A1 Oct. 20, 2022

(51) Int. Cl.
*G08B 3/00* (2006.01)
*H05K 13/08* (2006.01)
*G08B 21/02* (2006.01)

(52) U.S. Cl.
CPC ......... *H05K 13/0888* (2018.08); *G08B 21/02* (2013.01); *H05K 13/086* (2018.08)

(58) Field of Classification Search
CPC ............. H05K 13/0888; H05K 13/086; H05K 13/021; H05K 13/0417; G08B 21/02;
(Continued)

(56) References Cited

U.S. PATENT DOCUMENTS

| 2018/0111269 A1* | 4/2018 | Yamamoto | ............... F16P 3/144 |
| 2021/0053262 A1* | 2/2021 | Lin | ........................ B22D 33/02 |
| 2021/0195817 A1 | 6/2021 | Kuroda | |

FOREIGN PATENT DOCUMENTS

| JP | WO 2019/087392 A1 | 5/2019 |
| WO | WO 2018/179257 A1 | 10/2018 |
| WO | WO 2019/176038 A1 | 9/2019 |

OTHER PUBLICATIONS

International Search Report dated Nov. 12, 2019 in PCT/JP2019/038166 filed on Sep. 27, 2019, 2 pages.

* cited by examiner

*Primary Examiner* — Tai T Nguyen
(74) *Attorney, Agent, or Firm* — Oblon, McClelland, Maier & Neustadt, L.L.P.

(57) ABSTRACT

An automated replacement device moves in a right-left direction along a front surface of production line including multiple machines. The automated replacement device moves to a front side of an instructed machine among the multiple machines to perform an automated replacement operation on the machine. A periphery monitoring device monitors a safety area set in a periphery of the automated replacement device to stop an operation of the automated replacement device in an emergency manner when a person or an obstacle is detected in the safety area and alarm device sounds an alarm to notify that the automated replacement device is moving, in which the periphery monitoring device is switched such that a range of the safety area during the movement of the automated replacement device is smaller than a range of the safety area during the automated replacement operation.

6 Claims, 5 Drawing Sheets

(58) Field of Classification Search
CPC ........ G01S 17/42; G01S 17/87; G01S 17/931; G05B 19/41845; G06Q 10/0631; G06Q 50/04
USPC .......................................................... 340/679
See application file for complete search history.

AUTOMATED REPLACEMENT SYSTEM FOR PRODUCTION LINE

TECHNICAL FIELD

The present specification discloses a technology related to an automated replacement system for a production line including an automated replacement device that moves along a front surface of a production line configured by arranging multiple machines.

BACKGROUND ART

In recent years, for example, in a component mounting line, as described in Patent Literature 1 (International Publication No. WO2019/087392), there has been a case where a feeder automated replacement device is provided so as to be movable along a front surface of a component mounting line configured by arranging multiple component mounters, and the feeder automated replacement device moves to a front side of an instructed component mounter among the multiple component mounters, so that a feeder is automatically replaced with respect to the component mounter.

Even in the component mounting line provided with such a feeder automated replacement device, in a case where an error or the like generates in any component mounter while the component mounting line is in operation, an operator may go to the front side of the component mounter to perform an operation such as inspection or adjustment. In addition, in a case where a device (for example, a solder printing device, a conveyor, or the like) for a pre-process is installed adjacent to an upstream side of the component mounting line, or in a case where a device (for example, a reflow furnace, an inspection device, or the like) for a post-process is installed adjacent to a downstream side of the component mounting line, the operator may go to the front side of the device for the pre-process or the device for the post-process during operation of the component mounting line to perform an operation.

Accordingly, for safety measures, the feeder automated replacement device is provided with a periphery monitoring device for monitoring whether a person or an obstacle enters in a safety area set around the feeder automated replacement device, so that the operation of the feeder automated replacement device is stopped in an emergency manner when the periphery monitoring device detects a person or an obstacle in the safety area around the feeder automated replacement device.

PATENT LITERATURE

Patent Literature 1: International Publication No. WO2019/087392

BRIEF SUMMARY

Technical Problem

Incidentally, the feeder automated replacement device is configured as an industrial robot having X-axis, Y-axis, and Z-axis in order to perform operations in three-dimensional directions for automatically replacing the feeder on multiple component mounters. Therefore, a safety area around the feeder automated replacement device is also set as a safety area for an industrial robot. Since the safety area for the industrial robot is large, if the operator operates on the front side of any component mounter of the component mounting line during the operation of the component mounting line, or operates on the front side of the device for the pre-process or the post-process, the operator may inadvertently enter a large safety area around the moving feeder automated replacement device to cause the operation of the feeder automated replacement device to be stopped in an emergency manner. In particular, since the device for the pre-process or the post-process is installed outside a range in which the feeder automated replacement device moves, the operator operating on the front side of the device for the pre-process or the post-process tends to be careless because he/she thinks that there is no risk of collision with the moving feeder automated replacement device. However, since the safety area around the feeder automated replacement device is large, the operator operating on the front side of the device for the pre-process or the post-process may enter the safety area around the moving feeder automated replacement device, causing the operation of the feeder automated replacement device to be stopped in an emergency manner.

The above-described problems are not limited to the component mounting line including the feeder automated replacement robot, but are common to various production lines including an automated replacement robot that moves along the front surface of the production line configured by arranging multiple machines.

Solution to Problem

In order to solve the above-mentioned problems, there is provided an automated replacement system for a production line which is configured by arranging multiple machines and includes an automated replacement device that moves in an X-direction that is a right-left direction along a front surface of the production line, and in which the automated replacement device moves to a front side of an instructed machine among the multiple machines to perform an automated replacement operation on the machine, the automated replacement system including: a periphery monitoring device configured to monitor a safety area set in a periphery of the automated replacement device to stop an operation of the automated replacement device in an emergency manner when a person or an obstacle is detected in the safety area; and an alarm device configured to sound an alarm during a movement of the automated replacement device to notify that the automated replacement device is moving, in which the periphery monitoring device is switched such that a range of the safety area during the movement of the automated replacement device is smaller than a range of the safety area during the automated replacement operation.

In this case, during the movement of the automated replacement device, the automated replacement operation on each machine in the production line is not performed, but the machine moves in the right-left direction. Focusing on this point, by moving while the alarm is sounded by the alarm device during the movement of the automated replacement device, the automated replacement device during the movement can be regarded not as an industrial robot but as an unmanned conveyance vehicle. Therefore, the range of the safety area during the movement of the automated replacement device can be smaller than the range of the safety area during the automated replacement operation (range of the safety area as the industrial robot), so that the range of the safety area can be set to the range of the small safety area similar to the unmanned conveyance vehicle. Therefore, it is possible to reduce a possibility that an operator operating on the front side of the production line or on the front side of the device for the pre-process or the post-process enters the safety area around the moving automated replacement device during the operation of the production line, and it is possible to reduce a possibility that the operation of the automated replacement device stops in an emergency manner.

DESCRIPTION OF EMBODIMENTS

Hereinafter, an embodiment in which the present disclosure is applied and embodied to component mounting line 10 including feeder automated replacement device 26 will be described.

Figure 1:
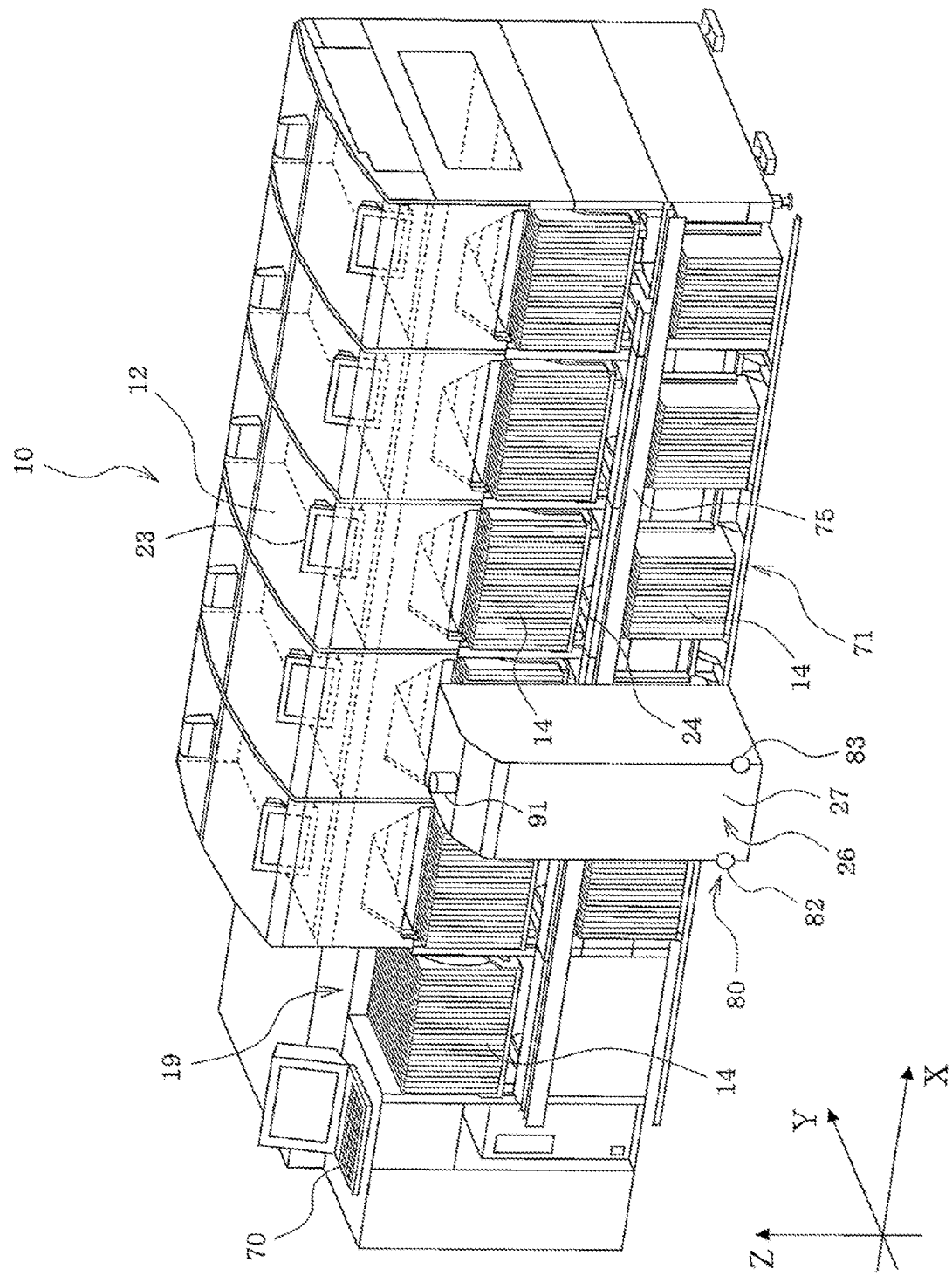
FIG. 1 is a perspective view illustrating an entire configuration of a component mounting line in an embodiment.
Figure 4:
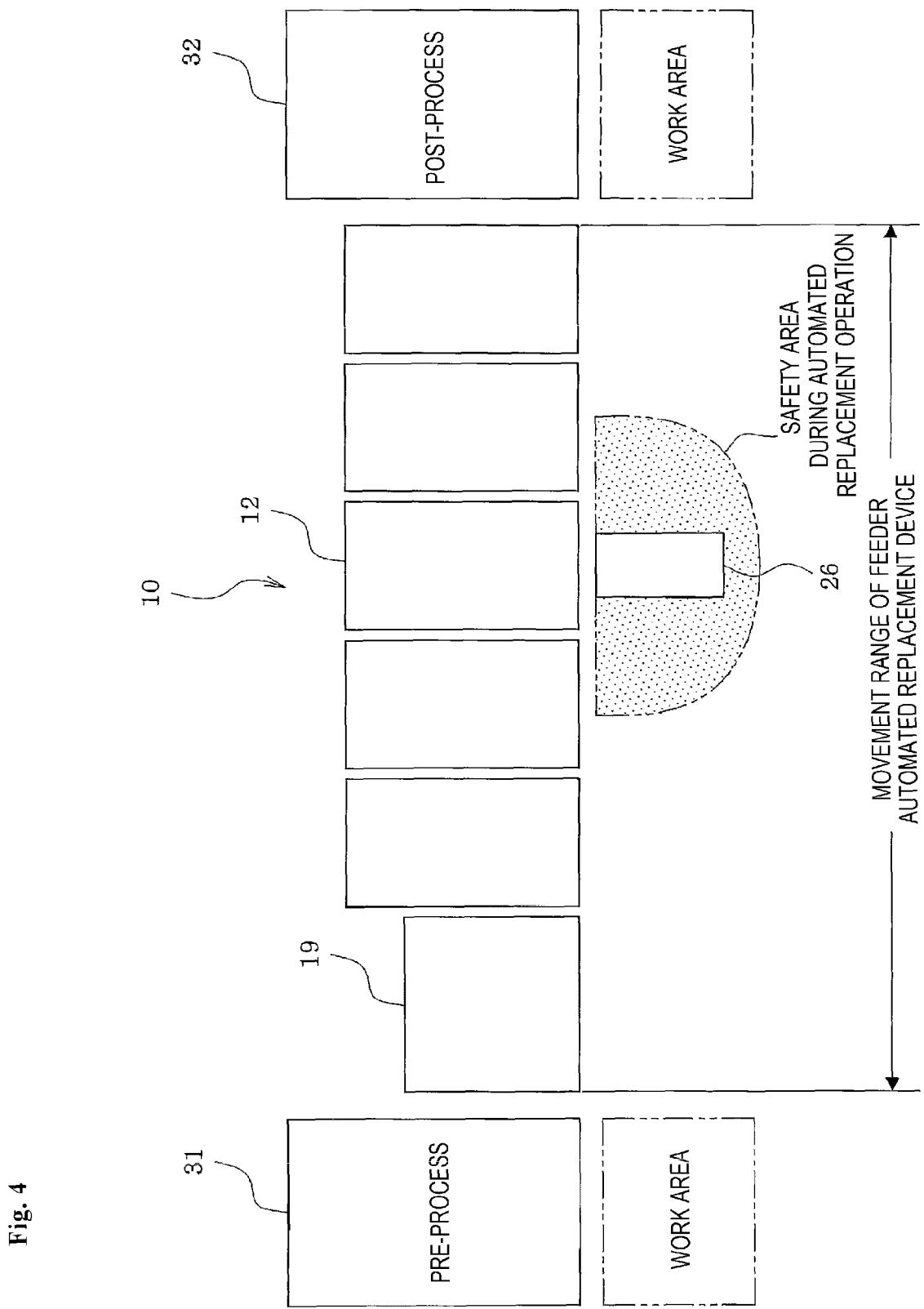
FIG. 4 is a plan view of the component mounting line illustrating a range of a safety area during an automated replacement operation of the feeder automated replacement device.
Figure 5:
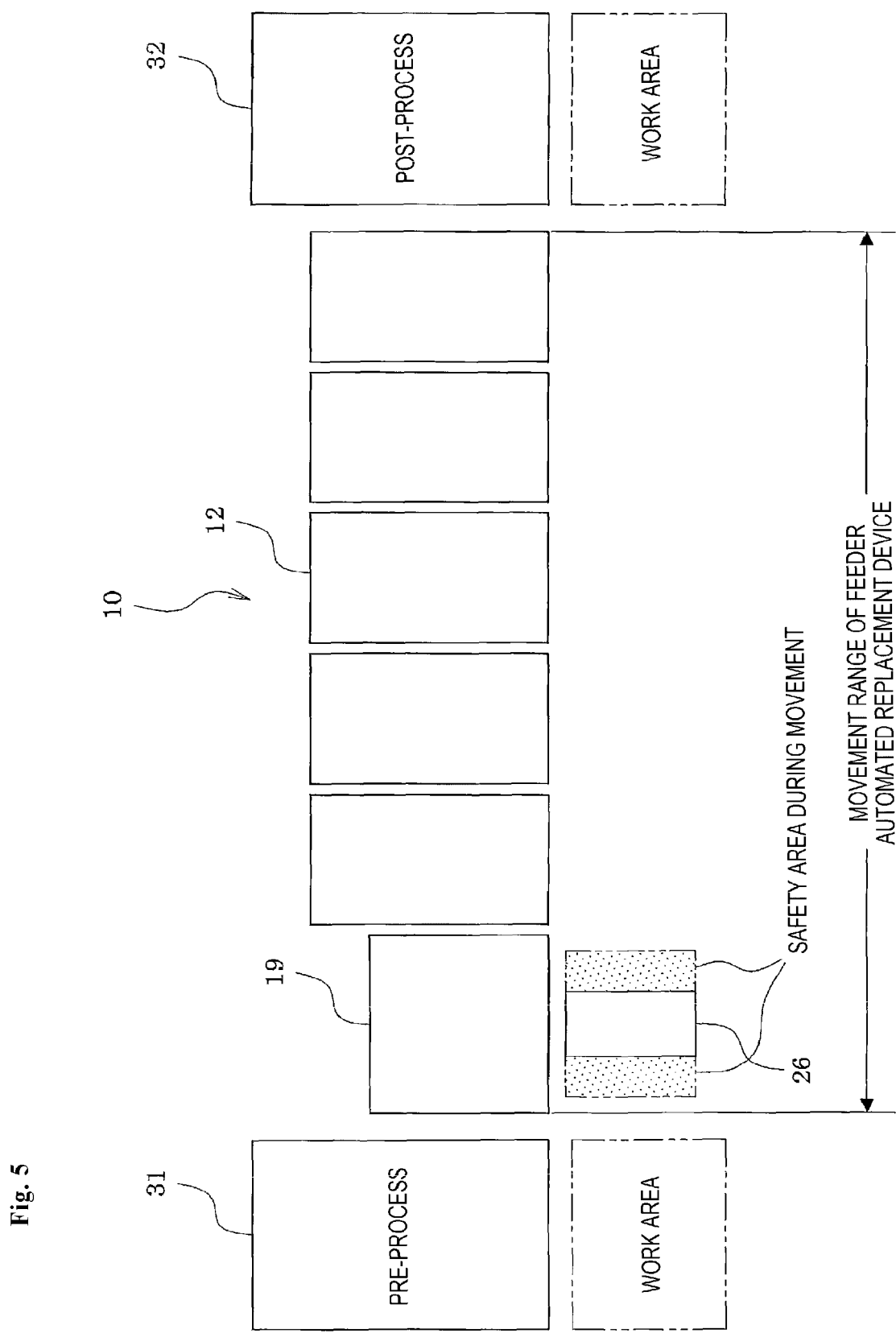
FIG. 5 is a plan view of the component mounting line illustrating a range of a safety area during a movement of the feeder automated replacement device.

First, a configuration of component mounting line 10 will be described with reference to FIGS. 1 to 5. As illustrated in FIG. 1, component mounting line 10 (production line) is configured by arranging multiple component mounters 12 (machines) in a row along a conveyance direction (X-direction) of circuit board 11, and feeder storage device 19 for storing cassette-type feeder 14 is installed on an upstream side of component mounting line 10. As illustrated in FIGS. 4 and 5, device 31 (for example, a solder printer, a conveyor, or the like) for a pre-process is installed adjacent to the upstream side of component mounting line 10, and device 32 (for example, a reflow furnace, an inspection device, or the like) for a post-process is installed adjacent to a downstream side of component mounting line 10.

Figure 2:
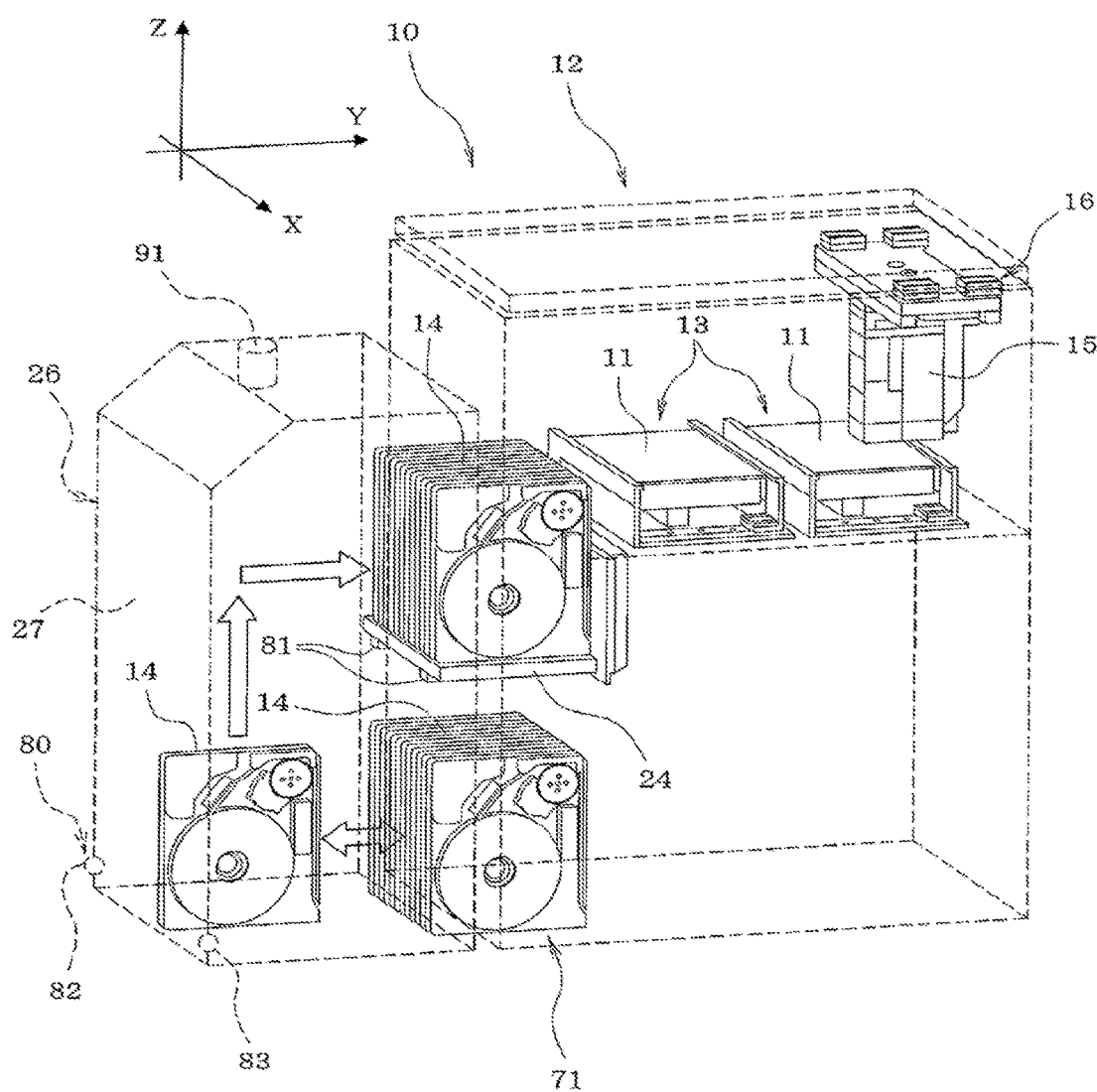
FIG. 2 is a perspective view schematically illustrating configurations of a feeder automated replacement device and a component mounter.

As illustrated in FIG. 2, each component mounter 12 is provided with two conveyors 13 for conveying circuit board 11, feeder setting base 24 (refer to FIG. 1) for replaceably setting multiple cassette-type feeders 14, mounting head 15 for holding suction nozzles (not illustrated) for picking up a component supplied from cassette-type feeder 14 set on feeder setting base 24 and mounting the same on circuit board 11, head moving device 16 for moving mounting head 15 in XY-directions (left-right and front-rear directions), component imaging camera 17 (refer to FIG. 3) for imaging the component picked up by the suction nozzles from below, and the like. Mark imaging camera 18 (refer to FIG. 3) for imaging a reference mark (not illustrated) of circuit board 11 is attached to head moving device 16 so as to move integrally with mounting head 15 in XY-directions.

Figure 3:
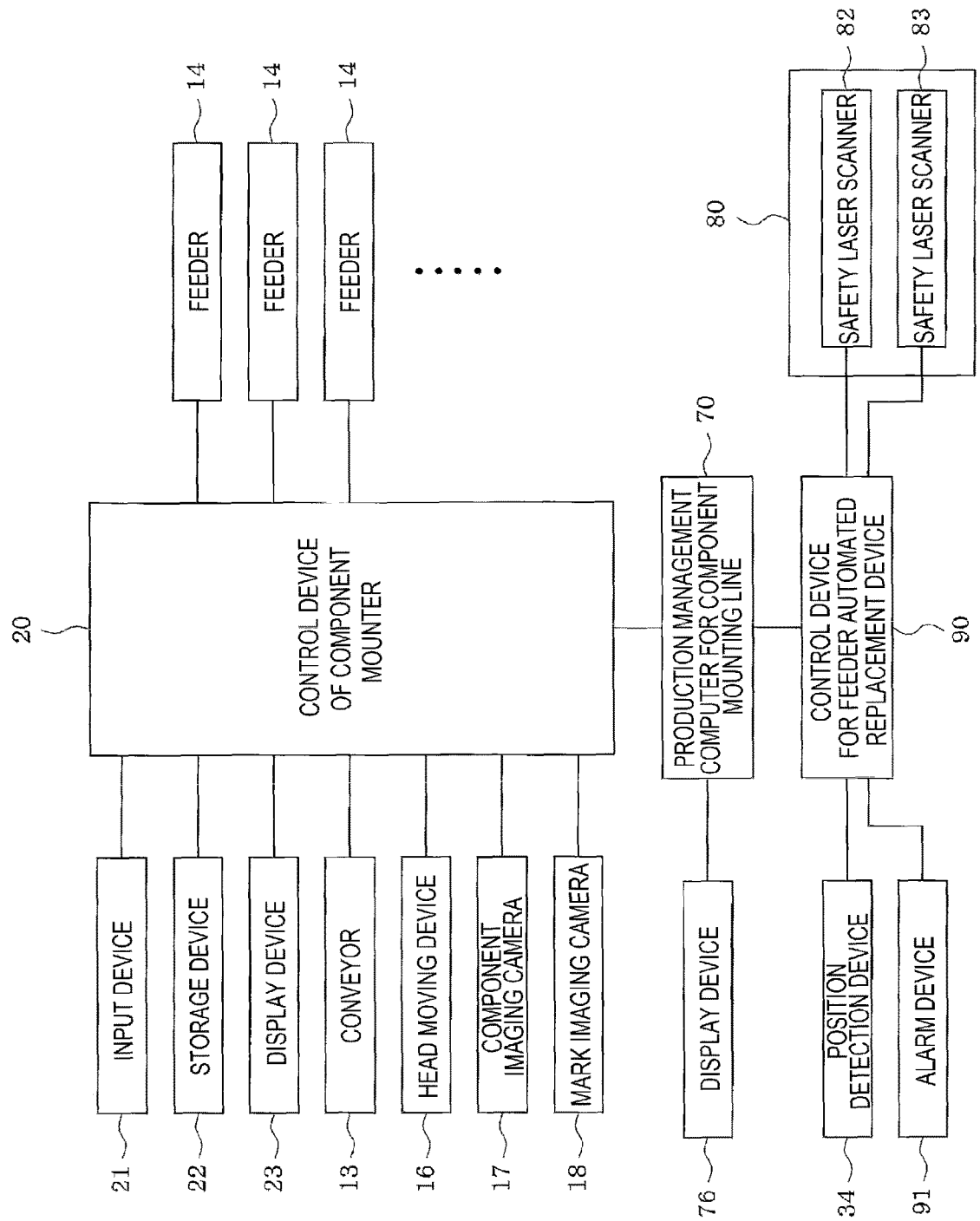
FIG. 3 is a block diagram schematically illustrating a configuration of a control system of the component mounting line with the feeder automated replacement device.

In addition, as illustrated in FIG. 3, input device 21 such as a keyboard, a mouse, and a touch panel, storage device 22 such as an HDD, an SSD, a ROM, or a RAM, for storing various programs and various data for control, display device 23 such as a liquid crystal display or a CRT are provided in control device 20 of component mounter 12. Control device 20 of each component mounter 12 is connected, via a network, to production management computer 70 (production management device) that manages production of entire component mounting line 10, such that the production of each component mounter 12 of component mounting line 10 is managed by production management computer 70.

Each component mounter 12 of component mounting line 10 conveys circuit board 11 conveyed from upstream component mounter 12 to a predetermined position with conveyor 13, clamps circuit board 11 with a clamping mechanism (not illustrated), images a reference mark of circuit board 11 with mark imaging camera 18, recognizes a position (reference position of circuit board 11) of the reference mark, picks up the component supplied from each feeder 14 with the suction nozzle of mounting head 15, moves the component from a suction position to an imaging position, images the component from below with component imaging camera 17, determines a suction positional deviation amount of the component, or the like, and then moves mounting head 15 to correct the suction positional deviation amount, and mounts the component on a predetermined position of circuit board 11 on conveyor 13 to produce the component mounting board.

As illustrated in FIG. 1, feeder automated replacement device 26 (automated replacement device) for setting and/or detaching (hereinafter, referred to as "automated replacement") feeder 14 to and from feeder setting base 24 of each component mounter 12 is installed on the front side of component mounting line 10. Below feeder setting base 24 of each component mounter 12, stock section 71 for accommodating multiple feeders 14 to be set in feeder setting base 24 is provided.

Production management computer 70 manages the production (placement of feeder 14, shortage of components, or the like) of each component mounter 12 of component mounting line 10, and instructs component mounter 12 that requires automated replacement of feeder 14 for control device 90 of feeder automated replacement device 26 when automated replacement of feeder 14 is required in any component mounter 12, feeder automated replacement device 26 moves to the front side of instructed component mounter 12, takes out feeder 14 of a replacement target from feeder setting base 24 of component mounter 12, collects feeder 14 in stock section 71, and takes out necessary feeder 14 from stock section 71 to set feeder 14 in feeder setting base 24. Feeder automated replacement device 26 may perform only an operation of collecting feeder 14 taken out from feeder setting base 24 into stock section 71 in response to the automated replacement instruction, or conversely, may perform only an operation of setting feeder 14 taken out from stock section 71 in an empty slot of feeder setting base 24.

On the front side of component mounting line 10, guide rail 75 for moving feeder automated replacement device 26 in X-direction (right-left direction) along the arrangement of component mounters 12 is provided so as to extend in X-direction over entire component mounting line 10. The upstream side of guide rail 75 extends to feeder storage device 19, and feeder automated replacement device 26 moves to the front side of feeder storage device 19, so that feeder automated replacement device 26 takes out feeder 14 required for the automated replacement from feeder storage device 19 or returns used feeder 14 into feeder storage device 19. The front surface, the right and left surfaces, and the upper surface of feeder automated replacement device 26 are covered with a protective cover 27 so that a movable portion of feeder automated replacement device 26 is not exposed to the operator's side (front side, right-left direction, and upper side).

Feeder automated replacement device 26 is provided with position detection device 34 (refer to FIG. 3) for detecting the position of feeder automated replacement device 26 with respect to component mounting line 10. When the automated replacement of feeder 14 of any of component mounters 12 is instructed by the production management computer 70, control device 90 of feeder automated replacement device 26 is configured to move to the front side of component mounter 12 to which the automated replacement of feeder 14 is instructed while detecting the position of feeder automated replacement device 26 by a detected signal of position detection device 34 so as to perform the operation of automatically replacing feeder 14. Feeder automated replacement device 26 is configured as an industrial robot having X-axis, Y-axis, and Z-axis in order to perform operations in three-dimensional directions for automatically replacing feeder 14 on multiple component mounters 12. In this case, feeder automated replacement device 26 operates as a robot that performs at least a Y-axis operation that is an operation in the front-rear direction and a Z-axis operation that is an operation in the vertical direction during the automated replacement operation, and, during the movement, stops at least the Y-axis operation, and moves in the right-left direction while causing alarm device 91 (described later) to sound an alarm to operate as an unmanned conveyance vehicle. At this time, the alert light may be blinked together with the alarm so as to reliably cause the operator to notice the alarm in both audibility and vision.

In addition to the automated replacement of feeder 14, although not illustrated, feeder automated replacement device 26 is configured to be capable of automatically replacing a cassette-type nozzle replacement unit accommodating a suction nozzle for replacement, a cassette-type calibration component supply unit supplying a calibration component, and the like with respect to feeder setting base 24.

In addition, feeder automated replacement device 26 is provided with periphery monitoring device 80 for monitoring a safety area set around feeder automated replacement device 26. As will be described later, in the present embodiment, the range of the safety area during the movement and the automated replacement operation of feeder automated replacement device 26 is switched such that the range (refer to FIG. 5) of the safety area during the movement is smaller than the range (refer to FIG. 4) of the safety area during the automated replacement operation.

Periphery monitoring device 80 is configured by two safety laser scanners 82 and 83 installed at left and right corner portions of a lower portion of a front surface of feeder automated replacement device 26. Each of safety laser scanners 82 and 83 is a safety sensor that detects a detection target that has intruded into the safety area by scanning the safety area with laser light by changing an irradiating angle of the laser light with which the safety area is irradiated, and receiving the laser light reflected upon hitting the detection target. The safety area is an area in which, when a person or an obstacle intrudes the area, the power source that is the power source of the driving system of feeder automated replacement device 26 is cut off to stop the operation of feeder automated replacement device 26 in an emergency manner in order to avoid collision between the person or the obstacle and feeder automated replacement device 26.

In the present embodiment, the range of the safety area during the movement and the automated replacement operation of feeder automated replacement device 26 is switched such that the range (refer to FIG. 5) of the safety area during the movement is smaller than the range (refer to FIG. 4) of the safety area during the automated replacement operation. As illustrated in FIG. 5, the safety area during the movement of feeder automated replacement device 26 is set so as to monitor only the right-left direction, which is the movement direction (X-direction and the opposite direction thereto) of feeder automated replacement device 26, and as illustrated in FIG. 4, the safety area during the automated replacement operation is set so as to monitor the right-left direction and the front of feeder automated replacement device 26.

When either of safety laser scanners 82 and 83 detects the intrusion of a person or an obstacle into the safety area, the power source of feeder automated replacement device 26 is cut off, and even during the cut-off of the power source, the control power supply that is the power source of the control system of periphery monitoring device 80 and feeder automated replacement device 26 is maintained, so that periphery monitoring device 80 monitors the presence or absence of the intrusion of the person or the obstacle into the safety area, and when the person or the obstacle being intruded into the safety area leaves the safety area, the power source of feeder automated replacement device 26 is restored to restart the operation of feeder automated replacement device 26.

In addition, in the present embodiment, feeder automated replacement device 26 is provided with alarm device 91 configured to sound an alarm during the movement of feeder automated replacement device 26 to notify the operator that feeder automated replacement device 26 is moving. Alarm device 91 may be only the alarm, or may blink an alert light together with the alarm so as to reliably cause the operator to notice the alarm in both audibility and vision.

As described above, feeder automated replacement device 26 is configured as the industrial robot having X-axis, Y-axis, and Z-axis in order to perform the operations in the three-dimensional directions for automatically replacing feeder 14 on the multiple component mounters 12. However, during the movement of feeder automated replacement device 26, the automated replacement operation on each component mounter 12 is not performed, and feeder automated replacement device 26 moves only in the right-left direction.

Focusing on this point, in the present embodiment, during the movement of feeder automated replacement device 26, feeder automated replacement device 26 during the movement can be regarded as the unmanned conveyance vehicle instead of the industrial robot by being moved while sounding the alarm by alarm device 91. Therefore, the range of the safety area during the movement of feeder automated replacement device 26 illustrated in FIG. 5 can be smaller than the range (range of the safety area as the industrial robot) of the safety area during the automated replacement operation illustrated in FIG. 4, so that it is possible to set to the small range of the safety area similar to the unmanned conveyance vehicle. Therefore, it is possible to reduce a possibility that the operator who operates in a work area on the front side of component mounting line 10 or on the front side of devices 31 and 32 for the pre-process and the post-process during the operation of component mounting line 10 enters the safety area around moving feeder automated replacement device 26, and it is possible to reduce a possibility that the operation of feeder automated replacement device 26 is stopped in an emergency manner.

In the present embodiment, the safety area during the movement of feeder automated replacement device 26 differs in both size and shape from the safety area during the automated replacement operation, but only the size of the safety area is different, and the safety area may have the same shape (similar shape).

In addition, since the front surface, the right and left surfaces, and the upper surface of feeder automated replacement device 26 are covered with protective cover 27, and even if feeder automated replacement device 26 performs the Z-axis operation, and the movable portion of feeder automated replacement device 26 is not exposed to the operator's side, the Z-axis operation may be performed during the movement (during the X-axis operation) of feeder automated replacement device 26. During the movement of feeder automated replacement device 26, there is no danger even if Z-axis operation is performed, and it is not necessary to switch the range thereof to the range of the safety area as the industrial robot. On the other hand, since a part of the movable portion protrudes rearward (in Y-direction) from a rear surface opening of feeder automated replacement device 26 during the Y-axis operation of feeder automated replacement device 26, it is necessary to switch to the range thereof the range of the safety area as the industrial robot when performing the Y-axis operation of feeder automated replacement device 26 (that is, when performing the automated replacement operation).

The installation location of alarm device 91 is not limited to feeder automated replacement robot 26, and alarm device 91 may be installed on the component mounting line 10 side. In a case where alarm device 91 is installed on the component mounting line 10 side, a new alarm device may be installed for alerting of feeder automated replacement robot 26, or an existing alarm device installed on the component mounting line 10 side may be shared.

In addition, although the present embodiment is an embodiment in which the present disclosure is applied to component mounting line 10 including feeder automated replacement robot 26, however, the configuration is not limited to this, and can be applied to various production lines including an automated replacement robot that moves along a front surface of a production line in which multiple machines are arranged.

In addition, the present disclosure is not limited to the configurations of the above embodiments, and it is needless to say that various modifications can be made without departing from the gist, such as, for example, the configuration of component mounting line 10 may be appropriately changed, the configuration of component mounter 12 may be appropriately changed, or the configuration of feeder automated replacement robot 26 may be appropriately changed.

REFERENCE SIGNS LIST

10 . . . component mounting line (production line), 11 . . . circuit board, 12 . . . component mounter (machine), 14 . . . cassette-type feeder, 15 . . . mounting head, 20 . . . control device of component mounter, 24 . . . feeder setting base, 26 . . . feeder automated replacement device (automated replacement device), 27 . . . protective cover, 31 . . . device for pre-process, 32 . . . device for post-process, 70 . . . production management computer (production management device), 80 . . . periphery monitoring device, 82, 83 . . . safety laser scanner, 90 . . . control device of feeder automated replacement robot, 91 . . . alarm device

The invention claimed is:

1. An automated replacement system for a production line which is configured by arranging multiple machines and includes an automated replacement device that moves in an X-direction that is a right-left direction along a front surface of the production line, and in which the automated replacement device moves to a front side of an instructed machine among the multiple machines to perform an automated replacement operation on the machine, the automated replacement system comprising:
a periphery monitoring device configured to monitor a safety area set in a periphery of the automated replacement device to stop an operation of the automated replacement device in an emergency manner when a person or an obstacle is detected in the safety area; and
an alarm device configured to sound an alarm during a movement of the automated replacement device to notify that the automated replacement device is moving,
wherein the periphery monitoring device is switched such that a range of the safety area during the movement of the automated replacement device is smaller than a range of the safety area during the automated replacement operation.

2. The automated replacement system for a production line according to claim 1,
wherein the safety area during the movement of the automated replacement device is set so as to monitor only a right-left direction which is a movement direction of the automated replacement device, and
the safety area during the automated replacement operation is set so as to monitor the right-left direction and a front of the automated replacement device.

3. The automated replacement system for a production line according to claim 1,
wherein the automated replacement device operates as a robot that performs at least a Y-axis operation that is an operation in a front-rear direction and a Z-axis operation that is an operation in a vertical direction during the automated replacement operation, and, during the movement, stops at least the Y-axis operation, and moves in the right-left direction while causing the alarm device to sound an alarm to operate as an unmanned conveyance vehicle.

4. The automated replacement system for a production line according to claim 1,
wherein the automated replacement device has a front surface, right and left surfaces, and an upper surface covered with a protective cover.

5. The automated replacement system for a production line according to claim 1,
wherein a device for a pre-process is installed adjacent to an upstream side of the production line, and
a device for a post-process is installed adjacent to a downstream side of the production line.

6. The automated replacement system for a production line according to claim 1,
wherein the production line is configured by arranging multiple component mounters that are the multiple machines, and
the automated replacement device moves to a front side of an instructed component mounter among the multiple component mounters to automatically replace a feeder with respect to the component mounter.

* * * * *